(12) United States Patent
Matsuda et al.

(10) Patent No.: US 7,214,305 B2
(45) Date of Patent: May 8, 2007

(54) METHOD OF MANUFACTURING ELECTRONIC DEVICE

(75) Inventors: Tetsuo Matsuda, Yokohama (JP); Hisashi Kaneko, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 384 days.

(21) Appl. No.: 10/636,614

(22) Filed: Aug. 8, 2003

(65) Prior Publication Data
US 2004/0226827 A1    Nov. 18, 2004

(30) Foreign Application Priority Data
May 14, 2003  (JP) ............... 2003-136011

(51) Int. Cl.
  *C25D 5/02*     (2006.01)
  *C23C 28/00*    (2006.01)
(52) U.S. Cl. ............... 205/123; 205/183; 205/186; 205/210
(58) Field of Classification Search ............... 205/123, 205/210, 183, 186
See application file for complete search history.

(56) References Cited

U.S. PATENT DOCUMENTS

| | | | |
|---|---|---|---|
| 6,024,857 A | 2/2000 | Reid | |
| 6,176,992 B1* | 1/2001 | Talieh | 205/87 |
| 6,491,806 B1* | 12/2002 | Dubin et al. | 205/296 |
| 6,605,534 B1* | 8/2003 | Chung et al. | 438/674 |
| 6,946,066 B2* | 9/2005 | Basol et al. | 205/118 |
| 2004/0069651 A1* | 4/2004 | Herchen et al. | 205/205 |
| 2004/0168928 A1* | 9/2004 | Hardikar | 205/296 |
| 2005/0153547 A1* | 7/2005 | Barns | 438/677 |

FOREIGN PATENT DOCUMENTS

| | | |
|---|---|---|
| EP | 1 122 989 A2 | 8/2001 |
| JP | 11-214838 | 8/1999 |
| JP | 2000-232078 | 8/2000 |
| JP | 2000-297395 | 10/2000 |
| JP | 2001-316866 | 11/2001 |
| JP | 2002-155390 | 5/2002 |
| JP | 2002-212779 | 7/2002 |
| JP | 2003-129273 | 5/2003 |

(Continued)

OTHER PUBLICATIONS

Japanese Office Action, mailed by the Japanese Patent Office on May 17, 2005, in counterpart Japanese Application No. 2003-136011.

(Continued)

*Primary Examiner*—Roy King
*Assistant Examiner*—William T. Leader
(74) *Attorney, Agent, or Firm*—Finnegan, Henderson, Farabow, Garrett & Dunner, L.L.P.

(57) ABSTRACT

Disclosed is a method of manufacturing an electronic device, comprising forming a concave portion on the surface of a base member, forming an electrically conductive seed layer on that surface of the base member on which a plated film is to be formed, and applying an electrolytic plating treatment with the seed layer used as a common electrode under the condition that a substance for accelerating the electrolytic plating is allowed to be present in the concave portion of the base member in an amount larger than that on the surface of the base member to form a plated film.

3 Claims, 7 Drawing Sheets

FOREIGN PATENT DOCUMENTS

WO        WO 00/26443        5/2000

OTHER PUBLICATIONS

Chinese Office Action, mailed by the Chinese Patent Office on Nov. 11, 2005, in counterpart Chinese Application No. 200410038320.2.
Japanese Office Action, mailed by the Japanese Patent Office on Feb. 14, 2006 in counterpart Japanese Application No. 2003-136011.

Mishima, K. et al., "Method and Apparatus for Plating Substrate with Copper", U.S. Appl. No. 09/492,138, filed Jan. 27, 2000.

Mishima, K. et al., "Plating Method and Plating Apparatus", U.S. Appl. No. 09/955,115, filed Sep. 19, 2001.

* cited by examiner

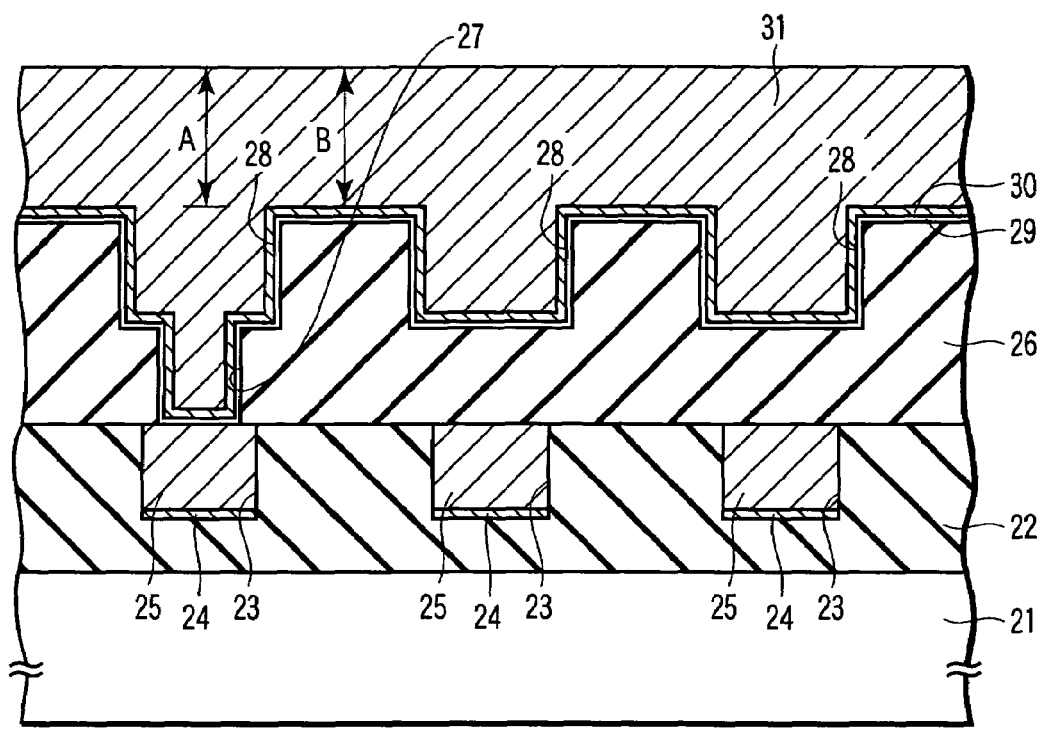
F I G. 5C
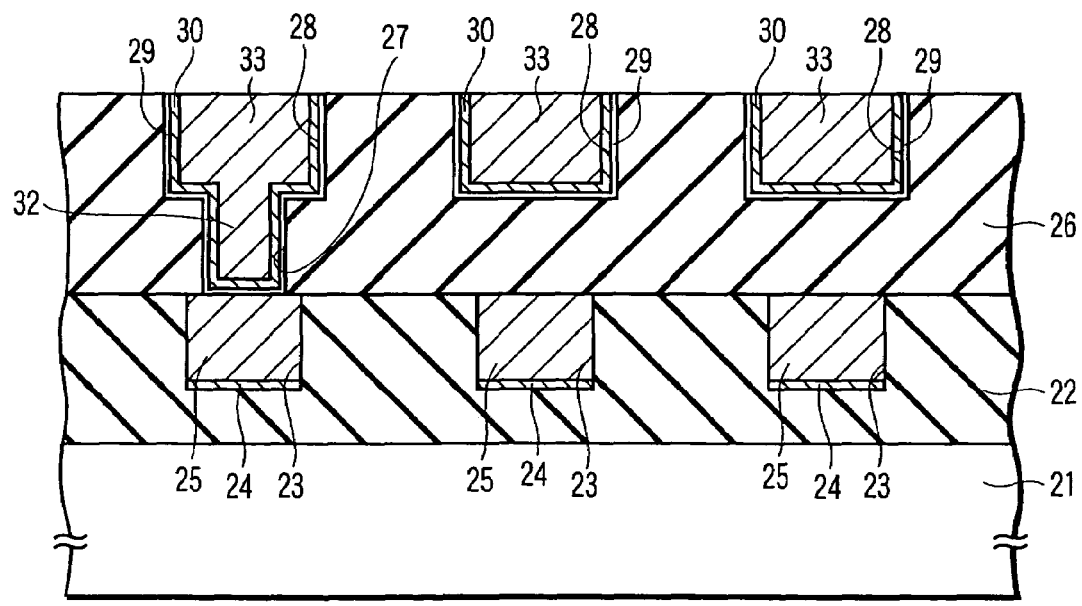
F I G. 5D

METHOD OF MANUFACTURING ELECTRONIC DEVICE

CROSS-REFERENCE TO RELATED APPLICATIONS

This application is based upon and claims the benefit of priority from the prior Japanese Patent Application No. 2003-136011, filed May 14, 2003, the entire contents of which are incorporated herein by reference.

BACKGROUND OF THE INVENTION

1. Field of the Invention

The present invention relates to a method of manufacturing an electronic device, particularly, to a method of manufacturing an electronic device such as a semiconductor device, a liquid crystal display device or a printed circuit board, in which the step of forming a plated film is improved.

2. Description of the Related Art

In recent years, a copper wire having a low resistivity has been used in, for example, semiconductor devices. The copper wiring is formed by, for example, the method described in the following. In the first step, a trench or the like is formed in an insulating film above a semiconductor substrate, followed by forming a copper film on the surface of the insulating film including the trench. Then, a chemical mechanical polishing (CMP) treatment is applied to the copper film to permit the copper layer within the trench formed in the insulating film so as to form a buried wiring.

It was customary in the past to form the copper film by the electrolytic copper plating method because the electrolytically plated copper film exhibits high burying properties in a concave portion such as a trench and permits simplifying the manufacturing process so as to lower the manufacturing cost.

In the formation of a copper plated film by the electrolytic copper plating method, however, excess copper plated film is deposited and accumulated in regions other than the trench. FIG. 10 shows the situation. To be more specific, a trench (or a hole) 53 is formed in an underlying film 52 formed on a semiconductor substrate 51, followed by forming a seed layer 54 such as a copper layer on the underlying film 52 including the trench 53. Then, an electrolytic copper plating treatment is applied to the entire surface to permit a copper plated film 55 to be deposited and accumulated on the surface of the seed layer 54. At the same time, a film growth exceeding a uniform film thickness takes place in a region right above the trench 53, with the result that excess copper plated film 56 including a stepped portion is deposited and accumulated on the surface of the underlying film 52 other than the trench 53.

Under the circumstances, it is necessary to remove the excess copper plated film formed in the region other than the trench 53 by the CMP treatment. Naturally, a longer time is required for the CMP process, lower in productivity. What should also be noted is that, where the insulating film is formed of, for example, a low-k film, which is brittle, the degree of freedom and the margin of the process are sacrificed by the CMP treatment applied for a long time. For example, damage is done to the insulating film.

Under the circumstances, a method disclosed in PCT/US99/25656 WO 00/26443 is in which a member such as a polishing pad used in the CMP treatment is brought into contact with a semiconductor substrate that is to be subjected to a plating treatment, and simultaneously with or during the electrolytic plating treatment, the film polishing is carried out intermittently so as to suppress the growth of the film.

However, the prior art publication referred to above teaches no more than a method in which an electrolytically plated film is intermittently polished simultaneously with or during the electrolytic plating treatment. What should be noted is that the method disclosed in the prior art publication referred to above fails to overcome essentially the above-noted problem inherent in the prior art that excess copper plated film having a stepped portion is deposited on the surface of the underlying film other than the trench during the electrolytic plating treatment.

BRIEF SUMMARY OF THE INVENTION

According to one embodiment of the present invention, there is provided a method of manufacturing an electronic device, comprising:

forming a concave portion on the surface of a base member;

forming an electrically conductive seed layer on that surface of the base member on which a plated film is to be formed; and applying an electrolytic plating treatment with the seed layer used as a common electrode under the condition that a substance for accelerating the electrolytic plating is allowed to be present in the concave portion of the base member in an amount larger than that on the surface of the base member to form a plated film.

According to another embodiment of the present invention, there is provided a method of manufacturing an electronic device, comprising:

forming a concave portion on the surface of a base member;

forming an electrically conductive seed layer on that surface of the base member on which a plated film is to be formed; and applying an electrolytic plating treatment with the seed layer used as a common electrode under the condition that a substance for accelerating the electrolytic plating is supplied onto the surface of the base member including the concave portion, and the substance for accelerating the electrolytic plating is removed preferentially from the surface of the base member so that the removal rate of the substance for accelerating the electrolytic plating from the surface of the base member is predominantly higher than that from within the concave portion to form a plated film.

Further, according to still another embodiment of the present invention, there is provided a method of manufacturing an electronic device, comprising:

forming a concave portion on the surface of a base member;

forming an electrically conductive seed layer on that surface of the base member on which a plated film is to be formed; and applying an electrolytic plating treatment with the seed layer used as a common electrode under the condition that a layer of a substance for inhibiting an electrolytic plating is formed on the surface of the base member except the concave portion to form a plated film.

BRIEF DESCRIPTION OF THE SEVERAL VIEWS OF THE DRAWING

FIGS. 5A to 5D are cross-sectional views collectively showing a process of manufacturing a semiconductor device for Example 1 of the present invention;

DETAILED DESCRIPTION OF THE INVENTION

Figure 1A:
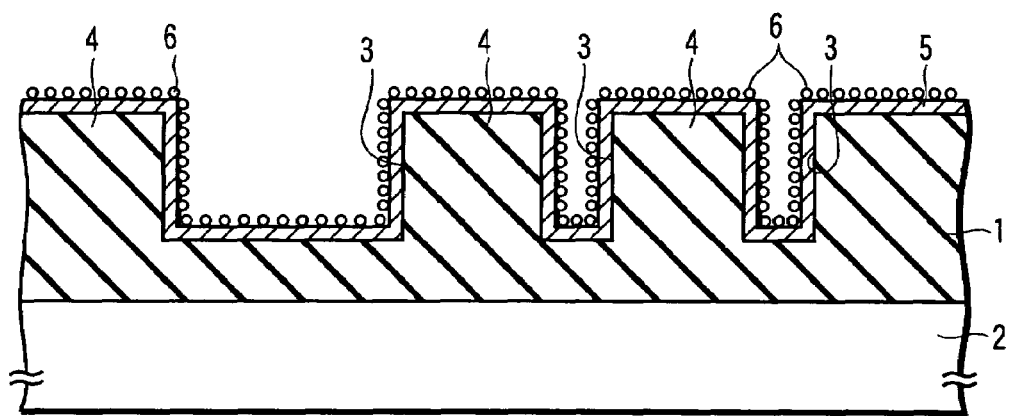
FIGS. 1A and 1B are cross-sectional views collectively showing the process of allowing a substance for accelerating the electrolytic copper plating to remain on the seed layer positioned within the concave portion according to a first embodiment of the present invention.

Some embodiments of the present invention will now be described in detail.

(First Embodiment)

In the first embodiment, detailed description is given of a method of manufacturing an electronic device, comprising the process of forming a copper plated wiring layer by an electrolytic copper plating treatment, e.g., a method of manufacturing a semiconductor device (large scale integrated circuit).

(First Step)

After a concave portion is formed on the surface of a base member, an electrically conductive seed layer is formed on at least that surface of the base member on which a plated film is to be formed.

The base member used in the embodiment of the present invention includes, for example, a structure prepared by forming an insulating film in a manner to cover a semiconductor substrate such as a silicon substrate. To be more specific, the base member used in the embodiment of the present invention includes, for example, 1) a base member prepared by forming a first insulating film in direct contact with the surface of the semiconductor substrate, 2) a base member prepared by forming a first insulating film, a first wiring layer and a second insulating film in the order mentioned on the surface of the semiconductor substrate; and 3) a base member prepared by forming a first insulating film, a first wiring layer, a second insulating film, a second wiring layer, and a third insulating film in the order mentioned on the surface of the semiconductor substrate.

In the base member 2) referred to above, it is acceptable for the first wiring layer to include a via fill buried in the first insulating film.

The insulating film formed in the embodiment of the present invention includes, for example, a silicon oxide film, a boron-added phosphorus silicate glass film (GPSG film), a phosphorus-added silicate glass film (PSG film), a SiOF film, an organic spin-on glass film, a polyimide film and a low-k film.

The concave portion formed on the surface of the base member includes, for example, a trench, a hole, a recess and a combination thereof. The shapes of the hole and the recess are optional. It is possible for the hole and the recess to be shaped like, for example, a column, a truncated cone, a reversed truncated cone or a rectangular column. Also, it is possible for the trench to be shaped optional. For example, it is possible for the trench to have a flat bottom portion, or to be shaped like a mortar or a dome.

The electrically conductive seed layer performs the function of a common electrode in the electrolytic copper plating step described herein later. It is desirable for the seed layer to be formed of, for example, copper or nickel and to have a thickness of 10 to 20 nm. Also, the seed layer is formed by, for example, a sputtering method.

Incidentally, in forming the wiring layer made of copper in the concave portion of the base member, it is acceptable to form an electrically conductive barrier layer prior to the formation of the seed layer in order to prevent the diffusion of copper forming the wiring layer. It is possible for the electrically conductive barrier layer to be of a single layer structure or a laminate structure made of, for example, tantalum, tungsten, titanium or a nitride thereof.

(Second Step)

An electrolytic copper plating treatment is applied with the seed layer used as a common electrode under the condition that a substance for accelerating the electrolytic plating of copper is allowed to be present in the concave portion of the base member in a larger amount than that on the surface of the base member so as to form a plated copper film.

It is important in the second step to allow a substance for accelerating the electrolytic plating of copper to be in the concave portion of the base member in an amount larger than that on the surface of the base member. In other words, it is important for the concentration (or density) per unit area of the substance for accelerating the electrolytic plating of copper, which is present in the concave portion of the base member, to be higher than that of the substance for accelerating the electrolytic plating of copper, which is present on the surface of the base member.

The copper plating solution used for the electrolytic copper plating treatment contains copper sulfate as a basic component. The copper plating solution also contains traces of, for example, hydrochloric acid, high molecular weight compounds such as polyethylene glycol, which are generally called a polymer or a suppresser, a thio compound, and an azo compound. These additives are used in order to improve the burying properties of the electrolytically plated copper layer into the concave portion such as a hole or a trench, to improve the surface luster of the plated copper layer, and to improve the mechanical and electrical strength of the plated copper layer.

The thio compound contributes to the acceleration in the forming rate of the copper plated film and, thus, is called an electrolytic copper plating accelerator. The electrolytic copper plating accelerator used in the present invention includes, for example, sulfo propyl disulfide [$HO_3S(CH_2)_3SS(CH_2)_3SO_3H$:SPS].

The azo compound, which is called, for example, a leveler, acts as a plating inhibitor having ionic properties and contributes to the moderation of the fine irregularity and scratch formed on the film surface.

Incidentally, the plating components are used in various fashions depending on the manufacturers of the plating solution and, thus, the uses of the plating components are not classified accurately. However, the additives to the electrolytic solution serving to elevate the electrodeposition voltage of the plating metal are classified in general as, for example, a polymer, a suppresser, and a lever, and the additives serving to lower the electrodeposition voltage, i.e., serving to facilitate the plating, are classified in general as the electrolytic plating accelerator.

It is desirable for the concentration per unit area of the electrolytic copper plating accelerator, i.e., the substance serving to accelerate the electrolytic copper plating, which is present in the concave portion of the base member, to be at least 5 times, more desirably at least 200 times, as high as that of the electrolytic copper plating accelerator present on the surface of the base member.

It is possible to allow the electrolytic copper plating accelerator to be present in the concave portion of the base member in an amount larger than that on the surface of the base member, by, for example, (1) supplying the electrolytic copper plating accelerator into the concave portion of the base member prior to the electrolytic copper plating treatment, or (2) selectively removing continuously or intermittently the electrolytic copper plating accelerator supplied from the electrolytic copper plating solution onto the surface of the base member in applying the electrolytic copper plating by using an electrolytic copper plating solution containing the electrolytic copper plating accelerator. The methods (1) and (2) given above will now be described in detail.

Figure 1B:
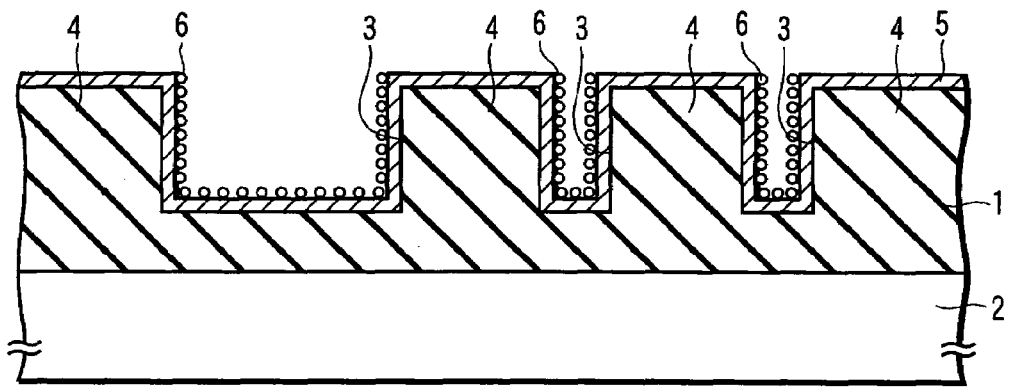

(1) Prepared is a base member such as a semiconductor substrate 2 covered with, for example, an insulating film 1 and, then, a concave portion 3 is formed on the surface 4 of the insulating film 1 of the base member, as shown in FIG. 1A. Then, a seed layer 5 is formed on the surface 4 including the concave portion 3 of the insulating film 1. After formation of the seed layer 5, the entire surface of the seed layer 5 is coated by, for example, a spin coating method with an aqueous solution of an electrolytic copper plating accelerator, followed by drying the coating so as to permit the electrolytic copper plating accelerator particles 6 to be deposited on the seed layer 5 corresponding to the concave portion 3 and the surface 4 of the insulating film 1. It is desirable for the concentration of the electrolytic copper plating accelerator particles in the aqueous solution to fall within a range of between 0.001 and 10% by weight. Then, the electrolytic copper plating accelerator particles 6 on the seed layer 5 positioned on the surface 4 of the insulating film 1 are removed by at least one of the physical, chemical and photochemical methods so as to permit the electrolytic copper plating accelerator particles 6 to remain on the seed layer 5 positioned in the concave portion 3 of the insulating film 1, as shown in FIG. 1B.

1-1) Physical Removing Method

A brush is brought into a sliding contact with the seed layer 5 positioned on the surface 4 of the insulating film 1 so as to remove the electrolytic copper plating accelerator particles 6 by the brushing effect.

In this method, it is possible to use a fin or a web in place of the brush. It is also possible to swell the brush with a pure water and to bring the swollen brush into a sliding contact with the seed layer 5 positioned on the surface 4 of the insulating film 1. In this case, the electrolytic copper plating accelerator particles 6 are removed by the brushing effect and by the diluting effect produced by the pure water.

1-2) Physical/Chemical Removing Method

A sponge material having a high hardness is impregnated with an aqueous solution containing sulfuric acid and hydrogen peroxide solution, and the particular sponge material is brought into a sliding contact with the seed layer 5 positioned on the surface 4 of the insulating film 1. In this case, the electrolytic copper plating accelerator particles 6 are removed physically and chemically.

1-3) Photochemical Removing Method

The surface of the seed layer 5 positioned on the upper portion of the concave portion 3 and the surface 4 of the insulating film 1 is obliquely irradiated with an ultraviolet light having a short wavelength so as to preferentially decompose the electrolytic copper plating accelerator particles 6 on the seed layer 5 positioned on the surface 4 of the insulating film 1, with the result that the electrolytic copper plating accelerator particles 6 are left unremoved on the seed layer 5 positioned within the concave portion 3 of the insulating film 1. The light irradiating angle can be selected appropriately in accordance with, for example, the aspect ratio of the concave portion 3.

It is possible to carry out alternately each of the removing processes and the electrolytic copper plating treatment.

After the pretreatment described above for allowing the electrolytic copper plating accelerator particles to be retained on the seed layer positioned in the concave portion of the base member, applied is an electrolytic copper plating treatment, preferably, an electrolytic copper plating treatment with an electrolytic copper plating solution having a low concentration of the electrolytic copper plating accelerator. In this case, the electrolytically plated copper layer is buried in the entire concave portion of the base member and is formed in a small thickness based on the surface of the base member such that the surface of the plated copper layer including the region right above the concave portion is planarized.

To be more specific, in the initial stage of burying the plated copper film, the deposition and the growth of the electrolytically plated film of copper on the seed layer positioned within the concave portion of the base member is accelerated by the electrolytic copper plating accelerator remaining inside the concave portion so as to make it possible to suppress the excess deposition and accumulation of the electrolytically plated film of copper in the region right above the concave portion, particularly, a fine concave portion. As a result, it is possible to deposit and bury preferentially the electrolytically plated copper film in the concave portion of the base member under the state that the surface of the plated copper film is rendered flat. At the same time, it is possible to suppress the excess deposition of the electrolytically plated copper film on the seed layer positioned on the surface 4 of the base member. It follows that the electrolytically plated copper film is buried in the entire concave portion of the base member and is formed in a small thickness based on the surface of the base member such that the surface of the plated copper film including the region right above the concave portion is planarized.

Incidentally, it is not absolutely necessary for the electrolytic copper plating accelerator within the copper plating solution to be equal to the electrolytic copper plating accelerator coated in advance.

Figure 2:
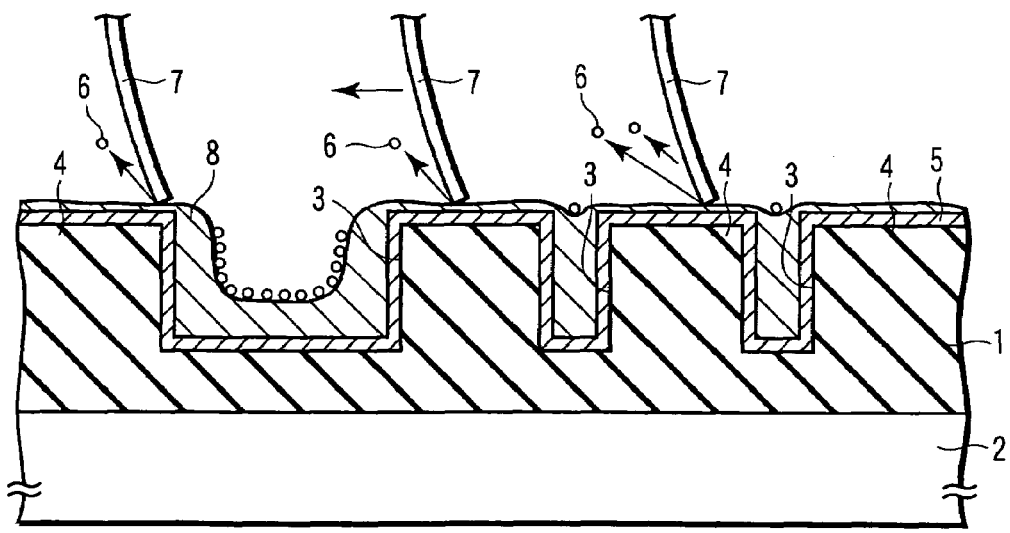
FIG. 2 is a cross-sectional view showing another method of allowing a substance for accelerating the electrolytic copper plating to remain on the seed layer positioned within the concave portion according to the first embodiment of the present invention.

(2) Prepared is a base member such as a semiconductor substrate 2 covered with, for example, an insulating film 1, and a concave portion 3 is formed on the surface 4 of the insulating film 1, as shown in FIG. 2. Then, a seed layer 5 is formed on the surface 4 including the concave portion 3 of the insulating film 1, followed by carrying out an electrolytic copper plating treatment with an electrolytic copper plating solution containing an electrolytic copper plating accelerator. In carrying out the electrolytic copper plating treatment, a removing member such as a brush 7 is continuously or intermittently brought into a sliding contact with the surface of the seed layer 5 positioned on the surface 4 of the insulating film 1 so as to remove selectively the electrolytic copper plating accelerator 6 supplied from the electrolytic copper plating solution onto the surface of the seed layer 5 positioned on the surface 4 of the insulating film 1. As a result, the deposition and growth of the electrolytically plated film 8 of copper is accelerated on the seed layer 5 positioned within the concave portion 3 in the initial stage of burying the plated copper film as shown in FIG. 2. On the other hand, it is possible to suppress the deposition of the electrolytically plated excess copper plated film 8 on the seed layer 5 positioned on the surface 4 of the insulating film 1. Also, the electrolytic copper plating accelerator condensed on the surface of the electrolytically plated copper film in a region right above the concave portion 3 is removed so as to make it possible to suppress the excess deposition and accumulation of the electrolytically plated copper film in the region right above the concave portion 3, particularly a fine concave portion. As a result, it is possible to deposit and bury preferentially the electrolytically plated copper film in the concave portion 3 of the base member such that the surface of the electrolytically plated copper film is rendered flat. It follows that the electrolytically plated copper film 8 is buried in the entire concave portion 3 of the base member and is formed in a small thickness based on the surface 4 of the base member such that the surface of the plated copper film 8 including the region positioned right above the concave portion 3 is planarized.

In the method described above, it is possible to use a fin or a web in place of the brush 7.

(Third Step)

A chemical mechanical polishing (CMP) treatment is applied after the plated copper film is buried in the concave portion of the base member by the electrolytic copper plating treatment described above so as to polish and remove the excess copper plated film from the surface of the base member, thereby forming a wiring layer such as a buried wiring or a via fill in the concave portion of the base member.

As described above, according to the first embodiment of the present invention, attentions are paid to the situation that the electrolytic copper plating accelerator such as sulfo propyl disulfide (SPS) is involved in the growth of the excess copper film that is electrolytically plated in the region right above the concave portion of the base member. Such being the situation, the electrolytic copper plating accelerator is allowed to be present on the seed layer positioned in the concave portion of the base member in an amount larger than that on the seed layer positioned on the surface of the base member. As a result, it is possible to permit the electrolytically plated copper film to be buried in the entire concave portion of the base member and to be formed in a small thickness based on the surface of the base member such that the surface of the plated copper film including the region positioned right above the concave portion is planarized. It follows that the first embodiment of the present invention produces prominent effects as pointed out below:

(i) Since it is possible to form the electrolytically plated copper film in a small thickness based on the surface of the base member such that the surface of the plated copper film including the region positioned right above the concave portion is planarized, it is possible to shorten the time required for the CMP treatment for forming a copper wiring layer after the electrolytic copper plating treatment. As a result, the time required for forming the copper wiring layer can be shortened so as to improve the productivity of the electronic device such as a semiconductor device and, thus, to lower the manufacturing cost of the electronic device. It is also possible to decrease the amount of copper discharged during the CMP treatment so as to alleviate the burden of the waste water processing.

(ii) Where a low-k film having a low dielectric constant is used as an insulating film in which is formed a concave portion such as a trench or a hole, the low-k film tends to be damaged or broken if the CMP treatment is carried out for a long time after the electrolytic copper plating treatment because the low-k film is brittle.

In the first embodiment of the present invention, however, it is possible to shorten the CMP treating time as pointed out in item (i) above. Therefore, it is possible to form a copper wiring layer such as a buried wiring or a via fill without doing damage to and without breaking the low-k film. It follows that the capacitance between the adjacent wiring layers can be lowered so as to improve the signal transmission speed and to manufacture an electronic device such as a semiconductor device having a high reliability.

(iii) Since the first embodiment of the present invention makes it possible to form an electrolytically plated copper film having a small thickness based on the surface of the base member such that the surface of the plated copper film including the region positioned right above the concave portion of the base member is planarized, it is possible to shorten the time required for the electrolytic copper plating treatment, compared with the conventional method. It follows that it is possible to improve the productivity of the electronic device such as a semiconductor device.

(Second Embodiment)

In the second embodiment of the present invention, described in detail is a method of manufacturing an electronic device, e.g., a semiconductor device (large scale integrated circuit), comprising the process of forming a plated copper wiring layer by the electrolytic copper plating treatment.

(First Step)

After formation of a concave portion on the surface of a base member, an electrically conductive seed layer is formed on at least that surface of the base member to which a copper plating is to be applied.

The base member, the concave portion and the seed layer for the second embodiment are substantially equal to those described previously in conjunction with the first embodiment.

(Second Step)

A layer of a substance for inhibiting the electrolytic copper plating is formed on the surface of the base member except the concave portion, and an electrolytic copper plating treatment is applied with the seed layer used as a common electrode so as to form preferentially a plated copper film in the concave portion of the base member.

The method of forming a layer of a substance for inhibiting the electrolytic copper plating on the surface of the base member except the concave portion will now be described in detail.

Figure 3A:
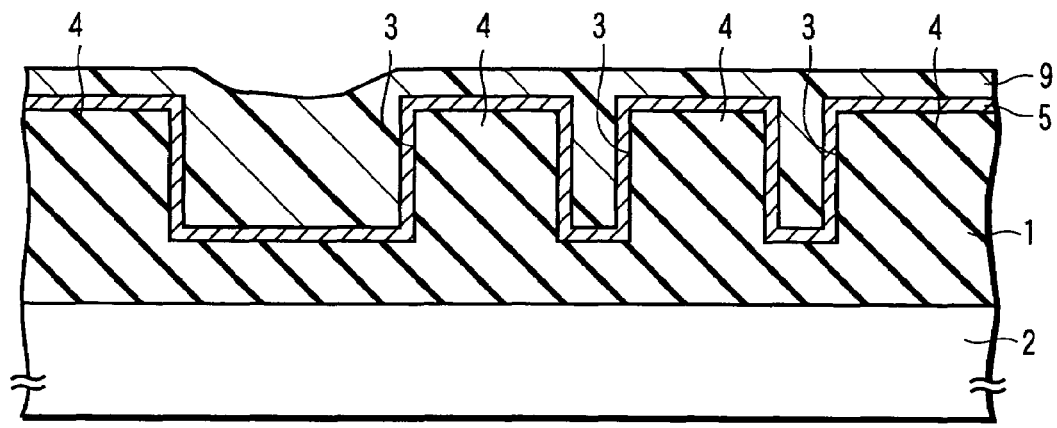
FIGS. 3A to 3C are cross-sectional views collectively showing the process of forming a layer of a substance for inhibiting the electrolytic copper plating on a seed layer positioned on the surface according to a second embodiment of the present invention.
Figure 3B:
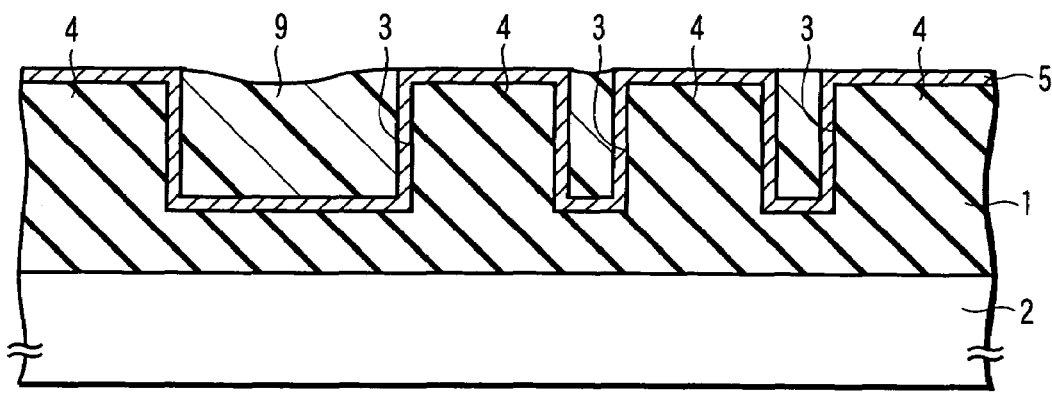
Figure 3C:
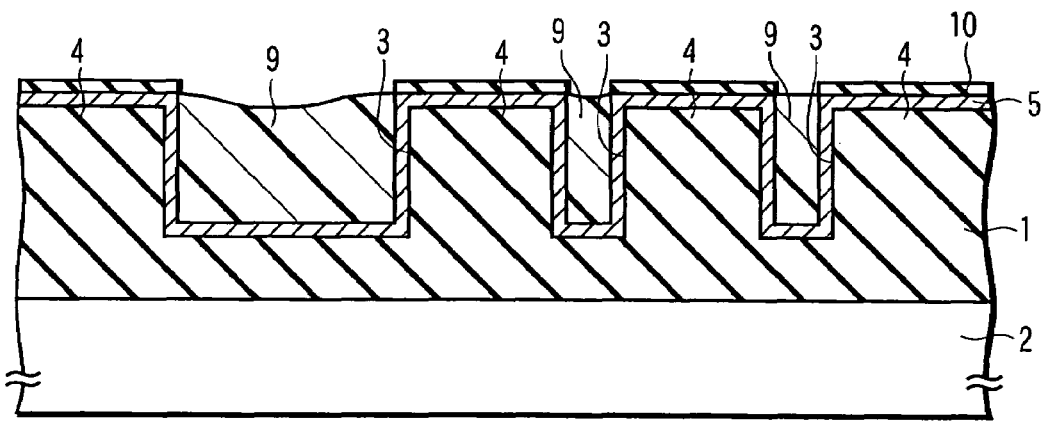

(1) Prepared is a base member such as a semiconductor substrate 2 covered with, for example, an insulating film 1, and a concave portion 3 is formed on the surface 4 of the insulating film 1, as shown in FIG. 3A. Then, a seed layer 5 is formed on the surface 4 including the concave portion 3 of the insulating film 1. After formation of the seed layer 5, the seed layer 5 corresponding to the surface 4 including the concave portion 3 is coated with a masking film 9, followed by planarizing the masking film 9. Then, the masking film 9 is etched back so as to permit the masking film 9 to be left unremoved on that portion of the seed layer 5 which is positioned in the concave portion 3 and to permit that portion of the seed layer 5 which is positioned on the surface 4 of the insulating film 1 to be exposed to the outside, as shown in FIG. 3B. In the next step, an oxidizing treatment is applied to the seed layer 5 positioned on the surface 4 of the insulating film 1 and exposed to the outside so as to form an oxide layer (copper oxide layer) 10 as a layer of a substance for inhibiting the electrolytic copper plating. Further, the masking film 9 is removed so as to permit the seed layer 5 positioned in the concave portion 3 of the insulating film 1 to be exposed to the outside.

It is desirable for the masking film, which is removed after formation of the oxide film, to be formed of a material having a high etching selectivity ratio relative to the oxide film. To be more specific, it is desirable for the masking film to be formed of, for example, a photoresist film or a spin-on glass film.

The masking film can be etched back by, for example, a reactive ion etching method. If an oxygen gas is used as a part of the etching gas in the etch back process, it is possible to carry out the oxidizing treatment after exposure to the outside of the seed layer on the surface of the base member (insulating film).

The oxidizing treatment can be performed by allowing, for example, an ozone water, an ozone gas, an oxygen gas, an oxygen plasma or an aqueous solution of hydrogen peroxide to act on the seed layer on the exposed surface.

If the seed layer on the exposed surface of the base member is oxidized in the entire thickness direction in performing the oxidizing treatment, the seed layer is electrically separated by the oxide layer depending on the shape of the concave portion, with the result that the seed layer fails to perform the function of the common electrode. In such a case, it is necessary to form an oxide layer in the surface region of the seed layer and to use the seed layer portion on the opposite side as a common electrode in the subsequent electrolytic copper plating treatment.

Where the seed layer has a thickness of 20 to 200 nm, it is desirable for the oxide layer to have a thickness of at least 10 nm. It should be noted in this connection that it is desirable for the thickness of that portion of the seed layer which is not oxidized in forming the oxide layer to be at least 10 nm.

It is possible to apply a nitriding treatment or an oxynitriding treatment in place of the oxidizing treatment.

(2) A concave portion 3 is formed on the surface 4 of the insulating film 1 of a base member such as a semiconductor substrate 2 covered with, for example, the insulating film 1 by the method substantially equal to that described in item (1) above, as shown in FIG. 3A. Then, a seed layer 5 is formed on the surface 4 including the concave portion 3 of the insulating film 1, followed by coating the seed layer 5 corresponding to the surface 4 including the concave portion 3 with a masking film 9 and subsequently planarizing the masking film 9. In the next step, the masking film 9 is etched back so as to permit the masking film 9 to be left unremoved on that portion of the seed layer 5 which is positioned in the concave portion 3 of the insulating film 1 and to permit that portion of the seed layer 5 which is positioned on the surface 4 of the insulating film 4 to be exposed to the outside. Then, an organic material layer is formed as a layer for inhibiting the electrolytic copper plating on that portion of the seed layer 5 which is positioned on the exposed surface 4 of the insulating film 1. Further, the masking film is removed so as to expose the seed layer 5 positioned within the concave portion 3 of the insulating film 1 to the outside.

The organic material layer can be formed on the seed layer positioned on the surface of the base member (insulating film 1) by, for example, the method that a hard sponge impregnated with an organic material is brought into a sliding contact with the surface of the base member.

The organic material used in the present invention includes, for example, an oil and fat, glycerin, and a fluorocarbon polymer.

It is also possible to use a high molecular weight compound (suppresser) or a leveler, which is a component of the electrolytic copper plating solution, in place of the organic material.

(3) A concave portion is formed on the surface of the insulating film of the base material such as a semiconductor substrate covered with the insulating film. Then, after formation of a seed layer on the surface including the concave portion of the insulating film, an insulating material is allowed to run with a directivity at a shallow angle relative to the base member so as to form preferentially an insulating film acting as a layer for inhibiting the electrolytic copper plating on the seed layer positioned on the surface of the insulating film.

The insulating material noted above includes, for example, silicon oxide, silicon nitride, and a fluorocarbon polymer.

Figure 4:
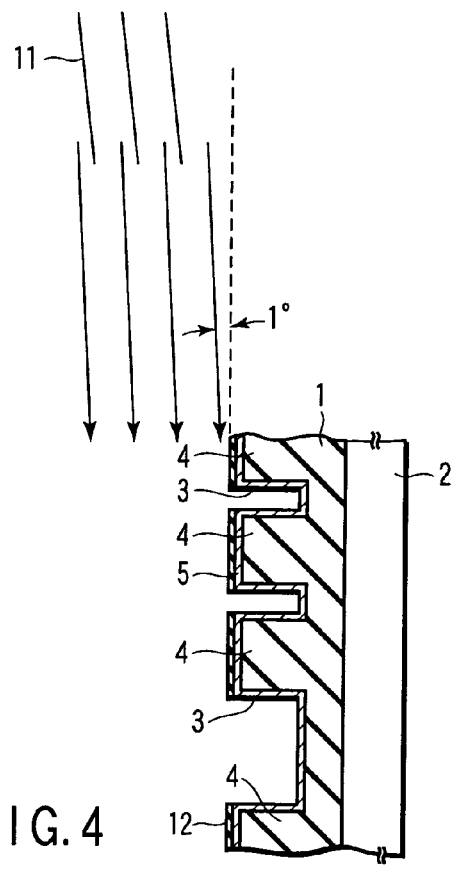
FIG. 4 is a cross-sectional view showing another method of forming a layer of a substance for inhibiting the electrolytic copper plating on a seed layer positioned on the surface according to the second embodiment of the present invention.

It is possible to allow the insulating material to run with a directivity by employing, for example, a sputtering method such as a high frequency sputtering method, an electron cyclotron resonance method or an induction coil-excited plasma method.

Where the directivity (anisotropy) of the insulating material is insufficient, a further improved effect can be obtained by utilizing a sputter or a long throw sputter using a collimator in which a channel having a high aspect ratio is arranged between the sputter target and the substrate. For example, a hole (concave portion) 3 of a high aspect ratio, which has a diameter of 30 μm and a depth of 200 μm, is formed in the insulating film 1 of the base member such as the semiconductor substrate 2 covered with the insulating film 1, as shown in FIG. 4. Then, the seed layer 5 is formed on the surface 4 including the concave portion 3. After formation of the seed layer 5, the semiconductor substrate 2 is disposed at a position 500 mm apart from a quartz target, and a film is formed on the seed layer 5 by a high frequency sputtering method with a collimator 11 arranged between the quartz target and the semiconductor substrate 2. The substrate 2 is rotated about its own axis while maintaining an angle of 1° between the axis of the target and the axis of the substrate 2. By the particular treatment, it is possible to form a silicon oxide film 12 on the surface 4 and within the hole (concave portion) 3 of the insulating film 1 within a range of about 0.5 μm (30 μm×tan 1°).

It is acceptable in the second embodiment of the present invention to form a layer of a substance for inhibiting the electrolytic copper plating on the surface of the base member in carrying out the electrolytic copper plating treatment and to apply the electrolytic copper plating treatment with the seed layer used as a common electrode so as to form preferentially a plated copper film in the concave portion of the base member. The method of forming a layer of a substance for inhibiting the electrolytic copper plating on the surface of the base member will now be described in detail.

(4) A seed layer is formed on the surface including the concave portion of the base member. Then, in applying an electrolytic copper plating treatment by using an electrolytic copper plating solution, a sponge material having a high hardness, which is impregnated with a fat and oil, a high molecular weight compound (suppresser) or a leveler, is brought into a sliding contact continuously or intermittently with the seed layer positioned on the surface of the base member so as to supply the substance for inhibiting the electrolytic copper plating onto the surface of the base member.

As already described in items (1) to (3) above, it is possible to form an electrolytically plated copper film buried in the entire concave portion of the base member such that the surface of the plated copper film including the region positioned right above the concave portion is planarized in substantially the same degree as that of the surface of the base member by applying the electrolytic copper plating treatment after the pretreatment to form a layer of the substance for inhibiting the electrolytic copper plating on the seed layer positioned on the surface excluding the concave portion of the base member.

To be more specific, the deposition of the plated copper film on the seed layer positioned on the surface excluding the concave portion of the substrate is inhibited by the substance for inhibiting the electrolytic copper plating in the initial stage of burying the plated copper film so as to inhibit the excess deposition of the plated copper film. At the same time, the deposition and growth of the plated copper film on the seed layer positioned within the concave portion are carried out preferentially so as to suppress the excess deposition and accumulation of the electrolytically plated copper film in the region right above the concave portion (particularly, a fine concave portion). As a result, it is possible to deposit and bury preferentially the electrolytically plated copper film in the concave portion of the base member under the state that the surface of the plated copper film is planarized in substantially the same level as that of the surface excluding the concave portion of the base member. It follows that the electrolytically plated copper film is buried in the entire concave portion of the base member and is formed such that the surface of the plated copper film including the region positioned right above the concave portion is planarized in substantially the same level as that of the surface excluding the concave portion of the base member.

It should also be noted that, as described in item (4) above, it is possible to form the electrolytically plated copper film buried in the entire concave portion of the base member in a very small thickness based on the surface excluding the concave portion of the base member such that the surface of the plated copper film including the region positioned right above the concave portion is planarized by supplying continuously or intermittently a substance for inhibiting the electrolytic copper plating onto the surface excluding the concave portion of the base member in applying an electrolytic copper plating treatment by forming a seed layer on the surface including the concave portion of the base member.

To be more specific, the deposition of the plated copper film on the seed layer positioned on the surface excluding the concave portion of the base member is suppressed or inhibited by the supplied substance for inhibiting the electrolytic copper plating in the initial stage of burying the plated copper film, with the result that the excess deposition of the plated copper film is suppressed or inhibited. At the same time, the deposition and growth of the plated copper film on the seed layer positioned in the concave portion are carried out preferentially so as to suppress the excess deposition and accumulation of the electrolytically plated copper film on the region right above the concave portion (particularly, a fine concave portion). As a result, it is possible to deposit and bury preferentially the electrolytically plated copper film in the concave portion of the base member under the state that the surface of the plated copper film is planarized. It follows that the electrolytically plated copper film is buried in the entire concave portion of the base member in a very small thickness based on the surface excluding the concave portion of the base member such that the surface of the plated copper film including the region right above the concave portion is planarized.

Incidentally, the deposition and the growing rate of the plated copper film on the seed layer positioned within the concave portion is accelerated by the deposition of the plated copper film in the case of applying the electrolytic copper plating treatment by using an electrolytic copper plating solution containing an electrolytic copper plating accelerator such as sulfo propyl disulfide (SPS) in each of items (1) to (4) given above so as to make it possible to suppress more effectively the excess deposition and accumulation of the electrolytically plated copper film in the region right above the concave portion (particularly, a fine concave portion).

(Third Step)

After the plated copper film is buried in the concave portion of the base member by the electrolytic copper plating treatment described above, a chemical mechanical polishing (CMP) treatment is applied so as to polish and remove the excess plated film of copper on the surface of the base member so as to form a wiring layer such as a buried wiring or a via fill in the concave portion of the base member.

As described above, according to the second embodiment of the present invention, it is possible to form an electrolytically plated copper film buried in the entire concave portion of the base member and having the surface including the region positioned right above the concave portion planarized in substantially the same level as that of the surface excluding the concave portion of the base member (or the electrolytically plated copper film having a very small thickness based on the surface of the base member and also having the surface including the region positioned right above the concave portion planarized) by forming a layer of a substance for inhibiting the electrolytic copper plating on the seed layer positioned on the surface excluding the concave portion of the base member. Because of the particular treatment, prominent effects can be produced in the second embodiment of the present invention as pointed out below:

(i) Since it is possible to form the electrolytically plated copper film in a very small thickness based on the surface of the base member such that the surface of the plated copper film including the region positioned right above the concave portion is planarized, it is possible to shorten the time required for the CMP treatment for forming a copper wiring layer after the electrolytic copper plating treatment. As a result, the time required for forming the copper wiring layer can be shortened so as to improve the productivity of the electronic device such as a semiconductor device and, thus, to lower the manufacturing cost of the electronic device. It is also possible to decrease the amount of copper discharged during the CMP treatment so as to alleviate the burden of the waste water processing.

(ii) Where a low-k film having a low dielectric constant is used as an insulating film in which is formed a concave portion such as a trench or a hole, the low-k film tends to be damaged or broken if the CMP treatment is carried out for a long time after the electrolytic copper plating treatment because the low-k film is brittle.

In the second embodiment of the present invention, however, it is possible to shorten the CMP treating time as pointed out in item (i) above. Therefore, it is possible to form a copper wiring layer such as a buried wiring or a via fill without doing damage to and without breaking the low-k film. It follows that the capacitance between the adjacent wiring layers can be lowered so as to improve the signal transmission speed and to manufacture an electronic device such as a semiconductor device having a high reliability.

(iii) Since the second embodiment of the present invention makes it possible to form an electrolytically plated copper film having a small thickness based on the surface of the base member such that the surface of the plated copper film including the region positioned right above the concave portion of the base member is planarized, it is possible to shorten the time required for the electrolytic copper plating treatment, compared with the conventional method. It follows that it is possible to improve the productivity of the electronic device such as a semiconductor device.

Incidentally, each of the first and second embodiments of the present invention described above is directed to a method of manufacturing a semiconductor device, e.g., a large scale integrated circuit, comprising the step of forming a plated copper wiring layer by the electrolytic copper plating treatment. However, the present invention is not limited to these particular cases. For example, the method of the present invention can also be applied similarly to the manufacturing method of a semiconductor device comprising the electrolytic plating step for the chip-on-chip, to the manufacturing method of a liquid crystal display element comprising the step of forming a wiring by the electrolytic plating treatment, and to the manufacturing method of a printed circuit board comprising the step of forming a wiring layer by the electrolytic plating treatment.

Also, the plated film formed by the electrolytic plating treatment is not limited to a plated film of copper. The method of the present invention can also be applied similarly to the formation of plated films of various metals such as an alloy of copper and another metal, as well as gold, silver, nickel, boron, and tin.

Some Examples of the present invention will now be described with reference to the accompanying drawings.

EXAMPLE 1

Figure 5A:
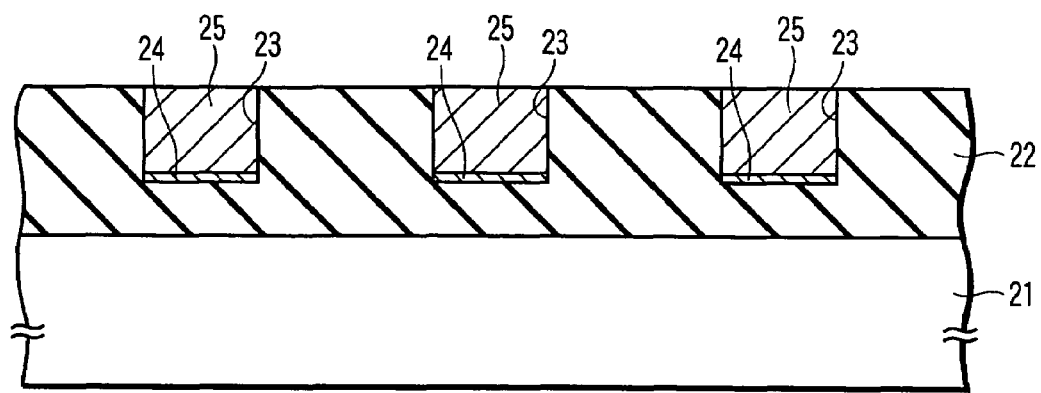

A first insulating film 22 made of $SiO_2$ and having a thickness of 0.4 μm was formed by, for example, a plasma CVD method on a semiconductor substrate 21 having an active region (not shown) formed therein in advance, followed by forming a trench 23 in the first insulating film 22, as shown in FIG. 5A. Incidentally, active elements such as a transistor and a capacitor were formed in the active region noted above. Then, a TiN film 24 constituting an electrically conductive barrier layer was formed in the bottom portion of the trench 23 by sputtering titanium under an atmosphere containing a nitrogen gas and an argon gas, followed by forming a buried wiring (lower wiring) 25 made of tungsten within the trench 23 by a DVD method using a film-forming gas containing $WF_6$ and $SiH_4$.

Figure 5B:
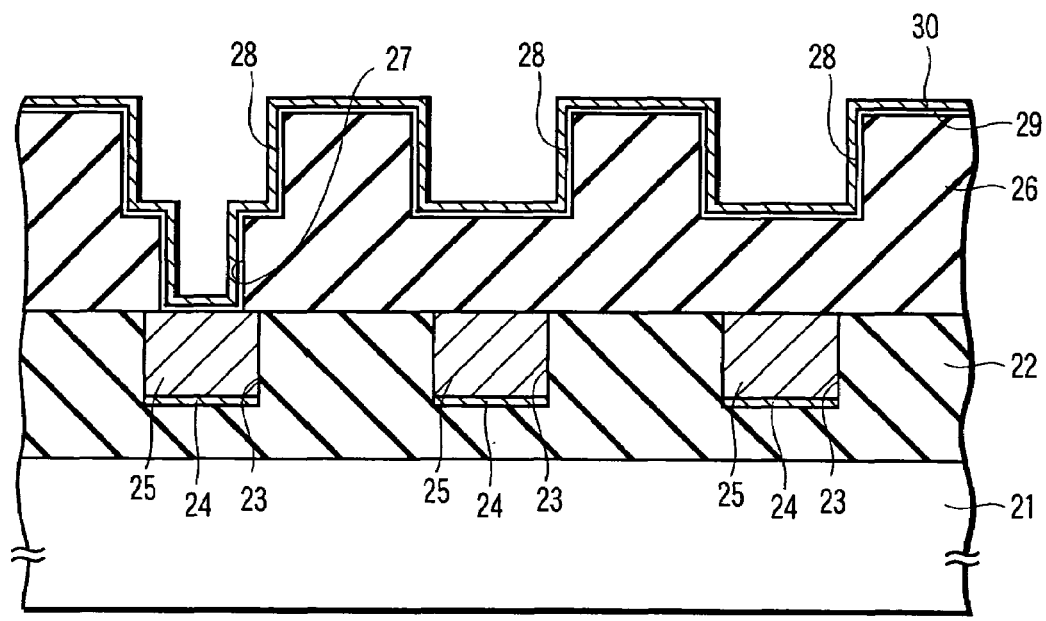

In the next step, a second insulating film 26 made of $SiO_2$ and having a thickness of 0.6 μm was formed by, for example, a plasma CVD method on the surface of the first insulating film 22 including the buried wiring 25, as shown in FIG. 5B. Then, a resist pattern (not shown) including an aperture formed in the portion where a via hole for connecting the upper and lower wirings was to be formed was formed by photolithography on the second insulating film 26, followed by anisotropically etching the second insulating film 26 by a reactive ion etching (RIE) method with the resist pattern used as a mask so as to form a via hole 27. Then, another resist pattern (not shown) including apertures in the portions where trenches were to be formed was formed again by the photolithography, followed by anisotropically etching that portion of the second insulating film 26 in which the via hole 27 was positioned and in the portion other than the via hole 27 so as to form a plurality of trenches 28 in the second insulating film 26. Incidentally, the trench 28 in which the via hole 27 was positioned was formed in a manner to communicate with the via hole 27. Each of these trenches 28 was formed in a depth about half the depth of the via hole 27, e.g., in a depth of 0.3 μm. Also formed was a trench (not shown) having the largest width of, e.g., 20 μm. Further, an electrically conductive barrier layer 29 made of tantalum nitride was formed in a thickness of, for example, 20 nm by a magnetron sputtering method on the surface of the second insulating film 26 including the via hole 27 and the trenches 28, followed by forming a seed layer 30 made of copper in a thickness of, for example, 100 nm on the electrically conductive barrier layer 29, as shown in FIG. 5B.

In the next step, the seed layer 30 on the surface of the second insulating film 26 including the via hole 27 and the trenches 28 was coated by a spin-coating method with an aqueous solution containing 1% by weight of sulfo propyl disulfide $[HO_3(CH_2)_3SS(CH_2)_3SO_3H: SPS]$ used as an electrolytic copper plating accelerator. After the surface of the semiconductor substrate 21 was dried, a brush cleaner wetted with a small amount of a pure water was brought into a sliding contact with the surface of the seed layer 30 positioned in the region excluding the via hole 28 and the trenches 28 so as to permit SPS to remain preferentially on the surface of the seed layer 30 positioned in the via hole 27 and the trenches 28. Then, the semiconductor substrate 21 having SPS retained thereon was dipped in a copper plating solution, and a negative potential was applied to the seed layer 30 so as to permit an electric current to flow through the copper plating solution between the seed layer 30 and an anode arranged to face the seed layer 30. The copper plating solution used was prepared by dissolving about 50 g of sulfuric acid, about 200 g of copper sulfate penta-hydrate, about 50 ppm of hydrochloric acid, and traces of various additives such as ethylene glycol in 1 L of water. The electrolytic copper plating was performed by using a DC current or a pulse current having a current density of 1 mA/cm$^2$ to 60 mA/cm$^2$. The precipitation rate, which was changed depending on the current density, was about 0.4 µm/min under the current density of 20 mA/cm$^2$.

By the electrolytic copper plating treatment described above, copper was preferentially deposited and accumulated on the surface of the seed layer 30 positioned in the via hole 27 and the trenches 28 and having SPS retained thereon so as to form a plated copper film 31 on the seed layer 30 on the surface of the second insulating film 26 including the via hole 27 and the trenches 28, as shown in FIG. 5C.

The plated copper film 31 was found to have 0.4 µm of thickness (A) between the open portion of the trench 28 and the surface of the plated copper film 31, i.e., the thickness right above the trench 28, and 0.4 µm of thickness (B) between the surface of the seed layer 30 positioned on the surface of the second insulating film 26 excluding the via hole 27 and the trenches 28 and the surface of the plated copper film 31. In other words, the plated copper film 31 was buried in the entire regions of the via hole 27 and the trenches 28, had a small thickness of 0.4 µm based on the surface of the seed layer 30 positioned on the surface of the second insulating film 26, and had a flat surface over the entire region including the regions right above the trenches 28.

Also, the time required for forming the plated copper film 31 in a manner to fill completely the trench having a width of 20 µm and to protrude upward slightly from the seed layer 30 on the surface of the second insulating film 26 was 65 seconds.

In the next step, a CMP treatment was applied to the plated copper film 31 and, then, to the seed layer 30 and the electrically conductive barrier layer 29, which were positioned on the surface excluding the via hole 27 and the trenches 28 of the second insulating film 26, so as to form a buried wiring (upper layer wiring) 33 made of copper in the second insulating film 26 and another buried wiring (upper layer wiring) 33 made of copper and electrically connected to the lower layer wiring 25 through the via fill 32, as shown in FIG. 5D, thereby obtaining a desired semiconductor device.

COMPARATIVE EXAMPLE 1

Figure 6:
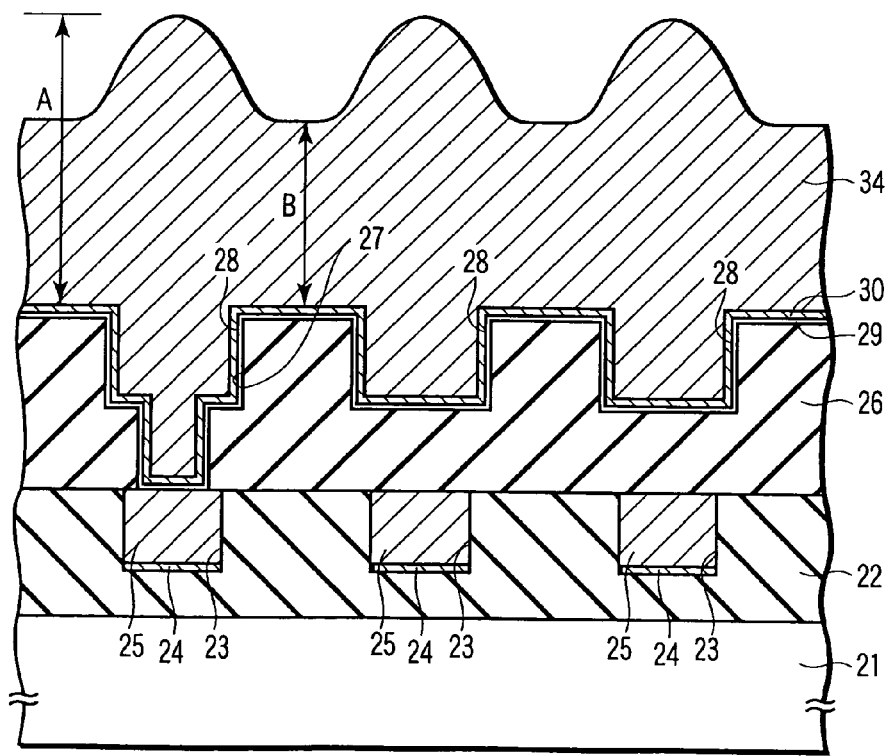
FIG. 6 is a cross-sectional view showing the state after the electrolytic copper plating treatment for Comparative Example 1 of a plated film of copper formed on a seed layer on the surface of a second insulating film including a via hole and a trench.

After formation of the seed layer 30, an electrolytic copper plating treatment was carried out as in Example 1 without involving the coating with sulfo propyl disulfide [SPS] and the brush cleaning. By the electrolytic copper plating treatment, a plated copper film 34 was formed on the seed layer 30 on the surface of the second insulating film 26 including the via hole 27 and the trenches 28 as shown in FIG. 6.

The plated copper film 31 thus formed was found to have 1.1 µm of a thickness (A) between the open portion of the trench 28 and the surface of the plated copper film 31, i.e., the thickness right above the trench 28, and 0.7 µm of thickness (B) between the surface of the seed layer 30 positioned on the surface of the second insulating film 26 excluding the via hole 27 and the trenches 28 and the surface of the plated copper film 34. Also, the time required for forming the particular plated copper film 34 was 115 seconds.

In the next step, a CMP treatment was applied as in Example 1 to the plated copper film 34 and to the seed layer 30 and the electrically conductive barrier layer 29 positioned on the surface of the second insulating film 26 so as to form in the second insulating film a buried wiring (upper layer wiring), not shown, made of copper and another buried wiring (upper layer wiring), not shown, made of copper and electrically connected to the lower wiring layer through the via fill, thereby manufacturing a semiconductor device.

In Comparative Example 1 described above, the plated copper film 34 was certainly buried in the entire regions within the via hole 27 and the trenches 28. However, an excessively large amount of the plated copper was deposited and accumulated in a thickness of 1.1 µm in the region right above the trenches 28, and an excessively large amount of the plated copper was deposited and accumulated in a thickness of 0.7 µm on the surface of the seed layer 30 positioned on the surface of the second insulating film 26.

On the other hand, in Example 1, the plated copper film 31 was buried completely in the via hole 27 and the trenches 28, as shown in FIG. 5C. Also, an excessive deposition and accumulation of the plated copper film 31 was suppressed in the regions right above the trenches 28 and, thus, the thickness of the plated copper film 31 was only 0.4 µm in the regions right above the trenches 28. In addition, an excessive deposition and accumulation of the plated copper film 31 was suppressed on the surface of the seed layer 30 positioned on the surface of the second insulating film 26 excluding the via hole 27 and the trenches 28 and, thus, the thickness of the plated copper film 31 was only 0.4 µm on the surface of the seed layer 30 positioned on the surface of the second insulating film 26 excluding the via hole 27 and the trenches 28. In other words, in Example 1, an excessive deposition and accumulation of the plated copper film 31 was suppressed and the plated copper film 31 was formed to have a flat surface over the entire region including the region right above the trenches 28.

As apparent from the comparison between Example 1 and Comparative Example 1, it was possible to shorten markedly the CPM treating time required for forming the via fill 32 and the buried wiring (upper layer wiring) 33, compared with Comparative Example 1.

It should also be noted that, in Example 1, the time required for forming the plated copper film 31 as shown in FIG. 5C was only 65 seconds, which was markedly shorter than the time (115 seconds) required for forming the plated copper film 34 in Comparative Example 1 as shown in FIG. 6.

EXAMPLE 2

The seed layer 30 on the surface of the second insulating film 26 including the via hole 27 and the trenches 28 was coated by a spin-coating method with an aqueous solution containing 1% by weight of sulfo propyl disulfide [HO$_3$(CH$_2$)$_3$SS(CH$_2$)$_3$SO$_3$H: SPS] used as an electrolytic copper plating accelerator by the method similar to that employed in Example 1. After the surface of the semiconductor substrate 21 was dried, the surface of the seed layer 30 positioned on the surface of the second insulating film 26 excluding the via hole 27 and the trenches 28 was obliquely irradiated with an ultraviolet light having a short wavelength. To be more specific, the surface of the seed layer 30 was irradiated with the ultraviolet light in a direction forming an angle of 2° with the surface of the semiconductor substrate 21. As a result, the plating accelerator SPS on the seed layer 30 positioned on the surface of the second insulating film 26 was preferentially decomposed so as to permit the plating accelerator SPS to be left on the seed layer 30 positioned within the via hole 27 and the trenches 28. Then, an electrolytic copper plating treatment was applied as in Example 1.

Figure 7:
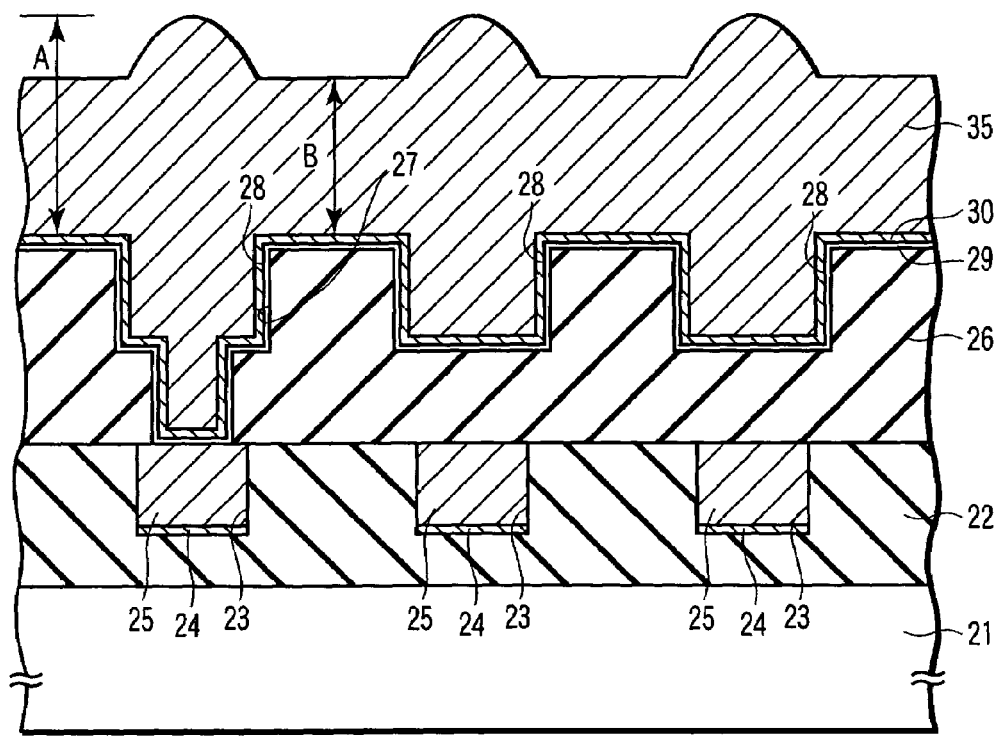
FIG. 7 is a cross-sectional view showing the state after the electrolytic copper plating in Example 2 for the present invention of the plated film of copper formed on a seed layer on the surface of the second insulating film including a via hole and a trench.

As a result of the electrolytic copper plating treatment, the metal copper was preferentially deposited and accumulated on the surface of the seed layer 30 positioned within the via hole 27 and the trenches 28, i.e., the surface having the plating accelerator SPS left thereon, so as to form a plated copper film 35 on the seed layer 30 on the surface of the second insulating film 26 including the via hole 27 and the trenches 28, as shown in FIG. 7.

The plated copper film 35 thus formed was found to have 0.7 μm of thickness (A) between the upper edge of the open portion of the via hole 27 and the surface of the plated copper film 35, i.e., the thickness right above the trench 28, and 0.5 μm of thickness (B) between the surface of the seed layer 30 positioned on the second insulating film 26 excluding the via hole 27 and the trenches 28 and the surface of the plated copper film 35. Also, the time required for forming the plated copper film 35 in a manner to fill completely the entire region of the trench having a width of 20 μm and to protrude upward slightly from the seed layer 30 on the surface of the second insulating film 26 was 83 seconds.

In the next step, a CMP treatment was applied to the plated copper film 35 and, then, to the seed layer 30 and the electrically conductive barrier layer 29, which were positioned on the surface of the second insulating film 26, so as to form a buried wiring (upper layer wiring), not shown, made of copper in the second insulating film and another buried wiring (upper layer wiring) made of copper and electrically connected to the lower layer wiring through the via fill 32, thereby obtaining a desired semiconductor device.

According to Example 2, the plated copper film 35 was buried completely in the via hole 27 and the trenches 28, as shown in FIG. 7. Also, an excessive deposition and accumulation of copper was suppressed in the regions right above the trenches 28 and, thus, the thickness of the plated copper film 35 was only 0.7 μm in the regions right above the trenches 28. In addition, an excessive deposition and accumulation of copper was suppressed on the surface of the seed layer 30 positioned on the surface of the second insulating film 26 excluding the via hole 27 and the trenches 28 and, thus, the thickness of the plated copper film 31 was only 0.5 μm on the surface of the seed layer 30 positioned on the surface of the second insulating film 26 excluding the via hole 27 and the trenches 28. In other words, in Example 2, an excessive deposition and accumulation of the plated copper film 35 was suppressed and the plated copper film 35 was formed to have a substantially flat surface over the entire region including the region right above the trenches 28. As a result, it was possible in Example 2 to shorten markedly the CPM treating time required for forming the via fill and the buried wiring (upper layer wiring), compared with Comparative Example 1.

Also, the time required for forming the plated copper film 35 in Example 2 as shown in FIG. 7 was 83 seconds, which was markedly shorter than the time (115 seconds) required for forming the plated copper film 34 in Comparative Example 1 as shown in FIG. 6.

EXAMPLE 3

Figure 8:
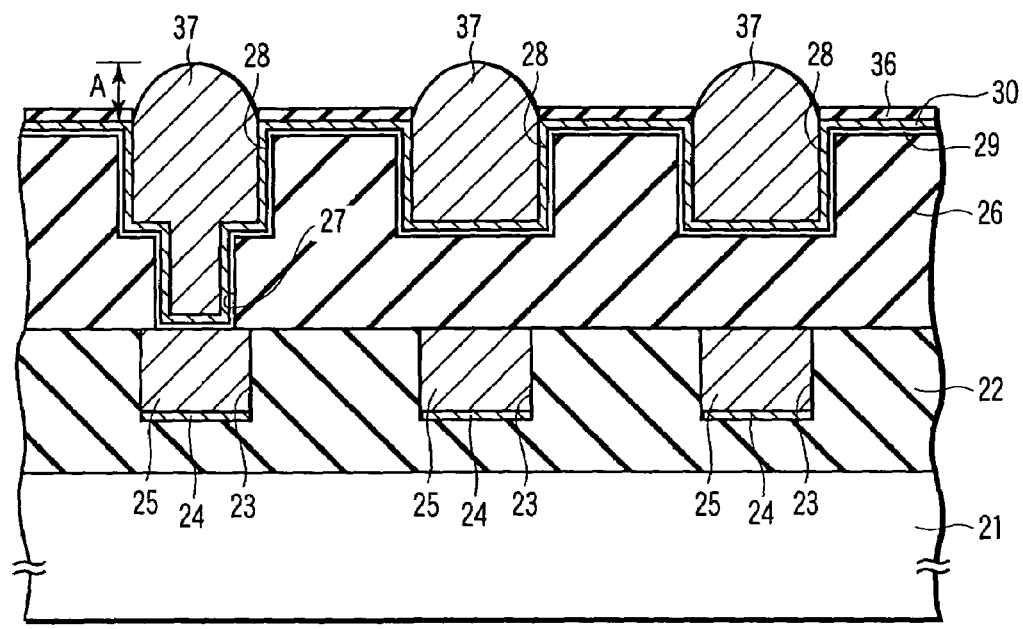
FIG. 8 is a cross-sectional view showing the state after the electrolytic copper plating in Example 3 for the present invention of the plated film of copper formed on a seed layer on the surface of the second insulating film including a via hole and a trench.

After formation of the seed layer 30 on the surface of the second insulating film 26 including the via hole 27 and the trenches 28 by a method similar to that employed in Example 1, the seed layer 30 was coated with a photoresist (not shown) so as to form a photoresist film having a flat surface. Then, the photoresist film was etched back by a reactive ion etching method so as to expose the seed layer positioned on the surface of the second insulating film 26 excluding the via hole 27 and the trenches 28 to the outside. Further, the exposed surface of the seed layer 30 was subjected to an oxidizing treatment by using an ozone water so as to form an oxide layer (copper oxide layer) 36 acting as an electrolytic copper plating inhibitor on the seed layer 30 positioned on the surface as shown in FIG. 8, followed by removing the residual photoresist film. Then, an electrolytic copper plating treatment was applied as in Example 1.

During the electrolytic copper plating treatment, the deposition of copper on the seed layer 30 positioned on the surface of the second insulating film 26 and covered with the oxide layer 36 was inhibited, and copper was preferentially deposited and accumulated on the surface of the seed layer 30 positioned within the via hole 27 and the trenches 28, with the result that a plated copper film 37 was formed on the seed layer 30 positioned within the via hole 27 and the trenches 28, as shown in FIG. 8.

The plated copper film 37 thus formed was found to have 0.1 μm of thickness (A) between the open portion of the trench 28 and the surface of the plated copper film 37, i.e., the thickness right above the trench 28. Also, copper was not deposited on the surface of the seed layer 30 positioned on the surface of the second insulating film 26 excluding the via hole 27 and the trenches 28.

Also, the time required for forming the particular plated copper film 37, which differs depending on the pattern of the underlying layer such as the depth and the density of the trenches formed in the second insulating film 26, was found to be about 5 to 15 seconds.

In the next step, a CMP treatment was applied to the plated copper film 37 and, then, to the seed layer 30 and the electrically conductive barrier layer 29, which were positioned on the surface of the second insulating film 26, so as to form a buried wiring (upper layer wiring), not shown, made of copper in the second insulating film and another buried wiring (upper layer wiring) made of copper and electrically connected to the lower layer wiring through the via fill, thereby obtaining a desired semiconductor device.

According to Example 3, the plated copper film 37 was buried completely in the via hole 27 and the trenches 28, as shown in FIG. 8. Also, an excessive deposition and accumulation of copper was suppressed prominently in the regions right above the trenches 28 and, thus, the thickness of the plated copper film 37 was only 0.1 μm in the regions right above the trenches 28. In addition, an excessive deposition and accumulation of copper was suppressed on the surface of the seed layer 30 positioned on the surface of the second insulating film 26 excluding the via hole 27 and the trenches 28 and, thus, the thickness of the plated copper film 37 was zero on the surface of the seed layer 30 positioned on the surface of the second insulating film 26 excluding the via hole 27 and the trenches 28. In other words, in Example 3, an excessive deposition and accumulation of the plated copper film 37 was substantially zero and the plated copper film 37 was formed to have a substantially flat surface having substantially the same level as the seed layer 30 positioned on the surface of the second insulating film 26 over the entire region including the region right above the trenches 28. As a result, it was possible in Example 3 to shorten markedly the CPM treating time required for forming the via fill and the buried wiring (upper layer wiring), compared with Comparative Example 1.

Also, the time required for forming the plated copper film 37 in Example 3 as shown in FIG. 8 was 5 to 15 seconds, which was markedly shorter than the time (115 seconds) required for forming the plated copper film 34 in Comparative Example 1 as shown in FIG. 6.

EXAMPLE 4

A seed layer 30 was formed on the surface of the second insulating film 26 including the via hole 27 and the trenches 28 by a method similar to the method employed in Example 1. Then, the semiconductor substrate 21 was disposed at a position 500 mm apart from a quartz target, and a collimator was arranged between the semiconductor substrate 21 and the quartz target. Under this condition, a high frequency sputtering treatment was applied while rotating the semiconductor substrate 21 about its own axis, with the angle between the axis of the semiconductor substrate 21 and the axis of the target maintained at 1°. As a result, a silicon oxide film 38 acting as an electrolytic copper plating inhibitor was formed selectively on the seed layer 30 positioned on the surface of the second insulating film 26 excluding the via hole 27 and the trenches 28. Then, an electrolytic copper plating treatment was applied as in Example 1.

Figure 9:
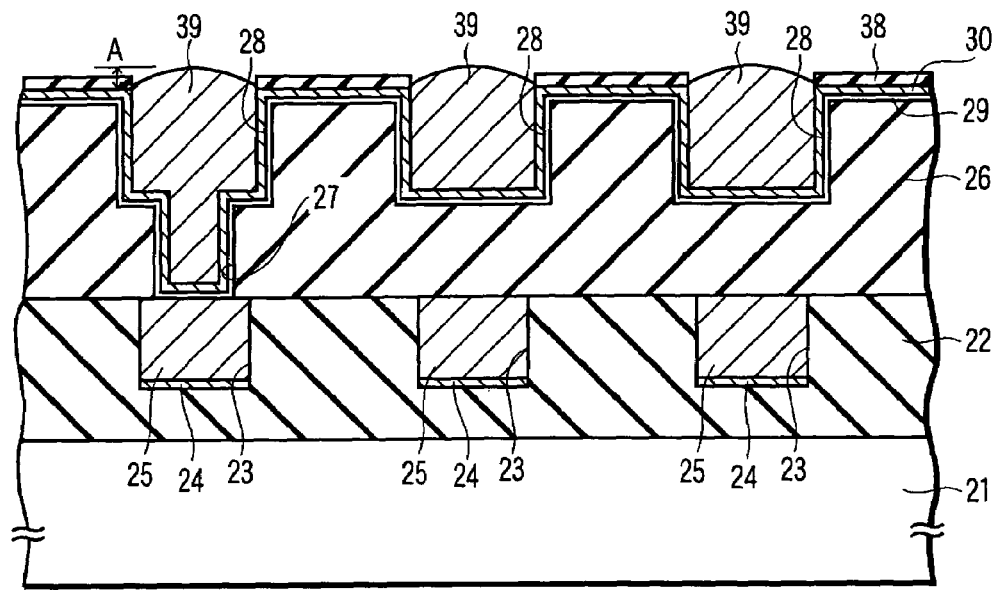
FIG. 9 is a cross-sectional view showing the state after the electrolytic copper plating in Example 4 for the present invention of the plated film of copper formed on a seed layer on the surface of the second insulating film including a via hole and a trench.
Figure 10:
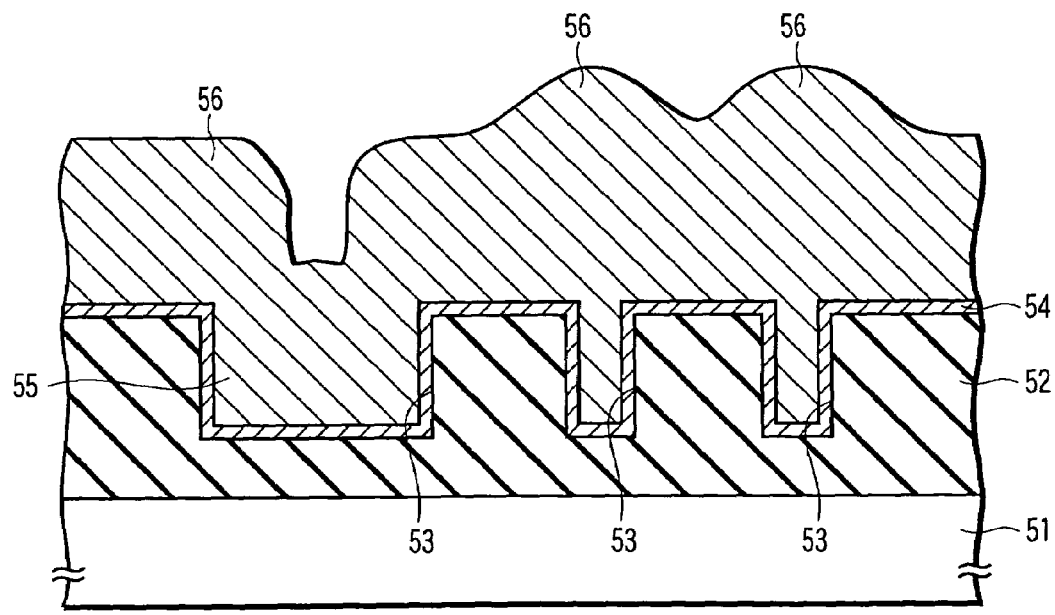
FIG. 10 is a cross-sectional view showing the state of the plated film of copper, covering the case where an electrolytic copper plating was applied by a conventional method to an underlying film having a trench.

During the electrolytic copper plating treatment, the deposition of copper on the seed layer 30 positioned on the surface of the second insulating film 26 and covered with the silicon oxide film 38 was inhibited, and copper was preferentially deposited and accumulated on the surface of the seed layer 30 positioned within the via hole 27 and the trenches 28, with the result that a plated copper film 39 was formed on the seed layer 30 on the surface of the second insulating film 26 within the via hole 27 and the trenches 28, as shown in FIG. 9.

The plated copper film 39 thus formed was found to have 0.05 μm of thickness (A) between the open portion at the upper edge of the via hole 27 and the surface of the plated copper film 39, i.e., the thickness right above the trench 28. Also, copper was not deposited on the surface of the seed layer 30 positioned on the surface of the second insulating film 26 excluding the via hole 27 and the trenches 28.

Also, the time required for forming the particular plated copper film 39, which differs depending on the pattern of the underlying layer such as the depth and the density of the trenches formed in the second insulating film 26, was found to be about 3 to 12 seconds.

In the next step, a CMP treatment was applied to the plated copper film 39 and, then, to the seed layer 30 and the electrically conductive barrier layer 29, which were positioned on the surface of the second insulating film 26, so as to form a buried wiring (upper layer wiring), not shown, made of copper in the second insulating film and another buried wiring (upper layer wiring) made of copper and electrically connected to the lower layer wiring through the via fill, thereby obtaining a desired semiconductor device.

According to Example 4, the plated copper film 39 was buried completely in the via hole 27 and the trenches 28, as shown in FIG. 9. Also, an excessive deposition and accumulation of copper was suppressed prominently in the regions right above the trenches 28 and, thus, the thickness of the plated copper film 39 was only 0.05 μm in the regions right above the trenches 28. In addition, an excessive deposition and accumulation of copper was suppressed on the surface of the seed layer 30 positioned on the surface of the second insulating film 26 excluding the via hole 27 and the trenches 28 and, thus, the thickness of the plated copper film 39 was zero on the surface of the seed layer 30 positioned on the surface of the second insulating film 26 excluding the via hole 27 and the trenches 28. In other words, in Example 4, an excessive deposition and accumulation of the plated copper film 39 was substantially zero and the plated copper film 39 was formed to have a substantially flat surface having substantially the same level as the seed layer 30 positioned on the surface of the second insulating film 26 over the entire region including the region right above the trenches 28. As a result, it was possible in Example 4 to further shorten the CPM treating time required for forming the via fill and the buried wiring (upper layer wiring), compared with Comparative Example 1.

Also, the time required for forming the plated copper film 39 in Example 4 as shown in FIG. 9 was 3 to 12 seconds, which was markedly shorter than the time (115 seconds) required for forming the plated copper film 34 in Comparative Example 1 as shown in FIG. 6.

Incidentally, in each of Examples 3 and 4, it is possible to make zero the thickness (A) of the plated copper film between the open portion in the upper edge of the via hole 27 and the surface of the plated copper film. However, it is practically desirable to ensure a somewhat large thickness (A) in view of the portion removed in the CMP treatment. It is also possible to make zero the thickness (A) of the plated copper film in the region right above the trench so as to omit the CMP treatment, thereby forming a damascene wiring such as a via fill or a buried wiring.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing an electronic device, comprising:
    forming a concave portion on the surface of a base member;
    forming an electrically conductive seed layer on that surface of the base member on which a plated film is to be formed; and
    applying an electrolytic plating treatment with the seed layer used as a common electrode under the condition that a layer of a substance for inhibiting electrolytic plating is formed on the surface of the base member except the concave portion to form a plated film,
    wherein the layer of the substance for inhibiting the electrolytic plating is formed by forming a film having a directivity, with the base member held inclined in the film-forming direction.

2. A method of manufacturing an electronic device according to claim 1, wherein the substance for inhibiting the electrolytic plating is an insulating material.

3. A method of manufacturing an electronic device according to claim 1, further comprising subjecting the plated film to a chemical mechanical polishing treatment so as to form a buried wiring in the concave portion of the base member.

* * * * *